United States Patent
Pešić

(10) Patent No.: US 11,804,556 B2
(45) Date of Patent: Oct. 31, 2023

(54) FERROELECTRIC-ASSISTED TUNNELING SELECTOR DEVICE

(71) Applicant: Applied Materials, Inc., Santa Clara, CA (US)

(72) Inventor: Milan Pešić, Paoli, PA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/884,408

(22) Filed: Aug. 9, 2022

(65) Prior Publication Data
US 2022/0392908 A1   Dec. 8, 2022

Related U.S. Application Data

(62) Division of application No. 17/064,097, filed on Oct. 6, 2020, now Pat. No. 11,411,125.

(51) Int. Cl.
*H01L 29/51* (2006.01)
*H01L 29/66* (2006.01)
(Continued)

(52) U.S. Cl.
CPC ............ *H01L 29/92* (2013.01); *H01L 29/516* (2013.01); *H01L 29/66083* (2013.01);
(Continued)

(58) Field of Classification Search
CPC ............ H01L 21/7688; H01L 21/8242; H01L 21/7682; H01L 21/76834; H01L 23/5222;
(Continued)

(56) References Cited

U.S. PATENT DOCUMENTS 5,751,037 A * 5/1998 Aozasa ............... H01L 27/115
                                                            257/E21.208
5,888,870 A * 3/1999 Gardner ............ H01L 29/66825
                                                            257/E21.422
(Continued)

FOREIGN PATENT DOCUMENTS

TW     202032782 A     9/2020
WO   2015040927 A1    3/2015
(Continued)

OTHER PUBLICATIONS

Application No. PCT/US2021/052509, International Search Report and Written Opinion, dated Jan. 14, 2022, 8 pages.

*Primary Examiner* — Sheikh Maruf
(74) *Attorney, Agent, or Firm* — Kilpatrick Townsend & Stockton LLP (57) ABSTRACT

A selector device may include a first electrode, a tunneling layer, and a ferroelectric layer. The tunneling layer may be between the first electrode and the ferroelectric layer, and a thickness and dielectric constant of the tunneling layer relative to a thickness and dielectric constant of the ferroelectric layer may cause a depolarizing electric field induced in the first tunneling layer to be greater than or approximately equal to an electric field induced in an opposite direction by ferroelectric dipoles in the ferroelectric layer when a voltage is applied across the selector device. The device may also include a second electrode, and the ferroelectric layer may be between the tunneling layer and the second electrode. A seconding layer may also be added between the ferroelectric layer and the second electrode for bipolar selectors.

18 Claims, 8 Drawing Sheets

(51) Int. Cl.
*H01L 29/92* (2006.01)
*H01L 29/78* (2006.01)
*H10B 53/30* (2023.01)

(52) U.S. Cl.
CPC .... *H01L 29/6684* (2013.01); *H01L 29/78391* (2014.09); *H10B 53/30* (2023.02)

(58) Field of Classification Search
CPC . H01L 23/52; H01L 21/768; H01L 21/76897; H01L 21/76831; H01L 27/10888
USPC ........................................................ 257/321
See application file for complete search history.

(56) References Cited

U.S. PATENT DOCUMENTS

| | | | |
|---|---|---|---|
| 6,048,766 A * | 4/2000 | Gardner | H01L 29/511 438/257 |
| 11,411,125 B2 | 8/2022 | Pesic | |
| 2004/0227177 A1* | 11/2004 | Yoshioka | H01L 29/40117 257/314 |
| 2005/0136637 A1* | 6/2005 | Li | H01L 29/513 257/E21.208 |
| 2006/0270147 A1* | 11/2006 | Ahn | H01L 21/28194 438/785 |
| 2012/0020140 A1 | 1/2012 | Chen | |
| 2014/0269002 A1 | 9/2014 | Jo | |
| 2015/0263069 A1 | 9/2015 | Jo | |
| 2018/0366591 A1 | 12/2018 | Song et al. | |
| 2018/0374929 A1* | 12/2018 | Yoo | G11C 11/223 |
| 2019/0019800 A1* | 1/2019 | Yoo | H01L 27/1159 |
| 2019/0058006 A1 | 2/2019 | Karpov et al. | |
| 2019/0148540 A1* | 5/2019 | Wang | H01L 29/78391 257/321 |
| 2019/0304986 A1* | 10/2019 | Dong | H01L 27/1159 |
| 2019/0304987 A1* | 10/2019 | Dong | H01L 29/788 |
| 2019/0304988 A1* | 10/2019 | Dong | H01L 29/516 |
| 2020/0020704 A1* | 1/2020 | Dong | H01L 29/40111 |
| 2020/0066791 A1 | 2/2020 | Hu et al. | |

FOREIGN PATENT DOCUMENTS

| | | |
|---|---|---|
| WO | 2019022732 A1 | 1/2019 |
| WO | 2019175236 A1 | 9/2019 |

* cited by examiner

FERROELECTRIC-ASSISTED TUNNELING SELECTOR DEVICE

CROSS-REFERENCE TO RELATED APPLICATIONS

This application is a divisional of U.S. patent application Ser. No. 17/064,097 filed Oct. 6, 2020 entitled "FERROELECTRIC-ASSISTED TUNNELING SELECTOR DEVICE," which is incorporated herein by reference.

BACKGROUND

A modern electronic neural network includes digital and/or analog circuitry that is inspired by, and seeks to approximate, the biological neural networks used by neurological systems found in nature. Like their natural counterparts, electronic neural networks attempt to learn and perform various tasks and recognize input stimuli without being pre-programmed using tasks-specific rules. This learning process may be accomplished using a collection of connected nodes representing artificial neurons which operationally approximate the behavior of neurons in a biological system. Connections between neurons may approximate the behavior of biological synapses to transmit signals between one or more artificial neurons. Multiple successive layers of neuron-and-synapse connections can be chained together to break complex tasks down into incremental stages. Therefore, an electronic neural network can be taught to perform new tasks in the same way that biological neural networks learn and grow over time.

Neural networks and other crossbar memory arrays may rely on combinations of memories and selectors to represent each individual memory element. The memory element represents a persistent memory that typically stores a single bit of information. The selector device paired with the memory element forms a current barrier that limits the leakage current that is experienced when nearby nodes in the memory array are activated on a word or bit line. Functioning selector elements are becoming more important as memory capacity continues to grow and power budgets continue to shrink. Therefore, improvements are needed in the art for developing small, efficient, low-power selector devices.

BRIEF SUMMARY

In some embodiments, a selector device may include a first electrode, a tunneling layer, and a ferroelectric layer. The tunneling layer may be between the first electrode and the ferroelectric layer. A thickness and dielectric constant of the tunneling layer relative to a thickness and dielectric constant of the ferroelectric layer may cause a depolarizing electric field to be greater than or approximately equal to an electric field induced in an opposite direction by ferroelectric dipoles in the ferroelectric layer when a voltage is applied across the selector device. The selector device may also include a second electrode, where the ferroelectric layer may be between the tunneling layer and the second electrode.

In some embodiments, a method of fabricating a selector device may include forming a first electrode, forming a tunneling layer, and forming a ferroelectric layer. The tunneling layer may be between the first electrode and the ferroelectric layer. A thickness and dielectric constant of the tunneling layer relative to a thickness and dielectric constant of the ferroelectric layer may cause a depolarizing electric field to be greater than or approximately equal to an electric field induced in an opposite direction by ferroelectric dipoles in the ferroelectric layer when a voltage is applied across the selector device. The method may also include forming a second electrode, where the ferroelectric layer may be between the tunneling layer and the second electrode.

In some embodiments, a selector device may include a first electrode and a tunneling layer including $Co_3O_4$ that may be between approximately 1 nm and approximately 3 nm thick. The selector device may also include a ferroelectric layer including aluminum nitride (AlN) doped with scandium (Sc) that may be between approximately 3 nm and approximately 10 nm thick, wherein the tunneling layer is between the first electrode and the ferroelectric layer. The selector device may further include a second electrode, where the ferroelectric layer may be between the tunneling layer and the second electrode.

In any embodiments, any and/or all of the following features may be incorporated in any combination and without limitation. The selector device may also include a second tunneling layer, where the second tunneling layer may be between the ferroelectric layer and the second electrode. The tunneling layer may have a dielectric constant less than approximately 20. The tunneling layer may have a bandgap energy of less than approximately 3.5 eV. The tunneling layer may be between approximately 1 nm and approximately 4 nm thick. The tunneling layer may include a layer of $Co_3O_4$. The tunneling layer may have an electron affinity that is greater than approximately 4.0 eV. The ferroelectric layer may include a material that spontaneously polarizes upon application of an electric field. The ferroelectric layer may include a layer of aluminum nitride (AlN) that is doped with scandium (Sc). The layer of aluminum nitride may be between approximately 3 nm and approximately 10 nm thick. The ferroelectric layer may include a layer of hafnium oxide. The layer of hafnium oxide may be between approximately 2 nm and approximately 4 nm thick. The layer of hafnium oxide may be doped with one or more of the following materials: Si, Y, Al, N, Ga, and Sr. The selector device may also include a connection to a memory element. The device and the memory element may be part of a crossbar memory array. The device and the memory element may be part of a neural network. The first electrode may include a first material and the second electrode may include a second material that is different from the first material. A work function associated with first electrode may be less than a work function associated with the second electrode.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an FIG. 1 illustrates a diagram of a portion of a neural network, according to some embodiments.

DETAILED DESCRIPTION

Figure 1:
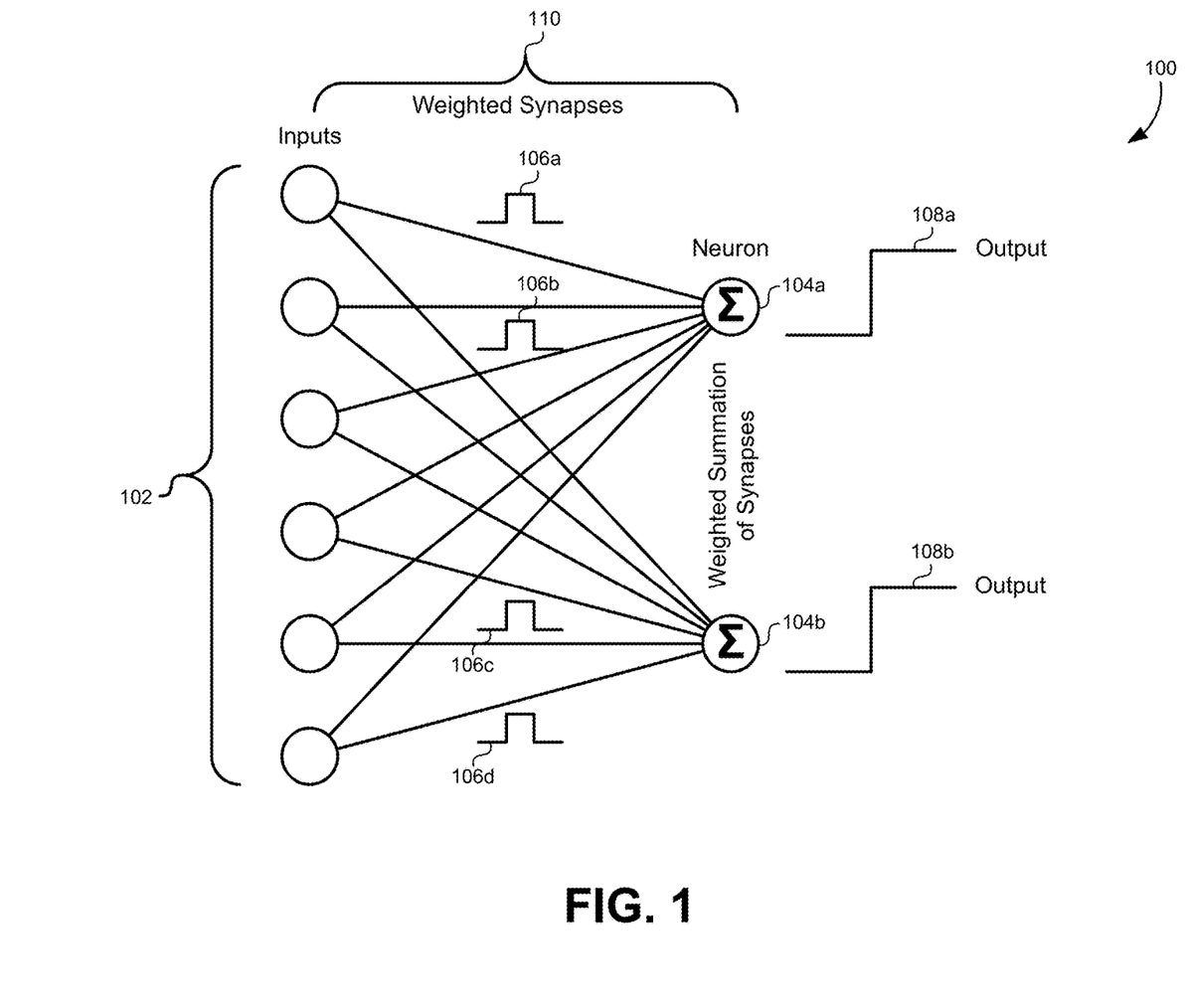

FIG. 1 illustrates a diagram of a portion of a neural network 100, according to some embodiments. The neural network 100 includes a plurality of inputs 102. The inputs may correspond to an input in a biological system, such as an axon representing a nerve fiber or a long slender projection of a neuron that conducts electrical impulses and acts as a transmission line in the nervous system. For example, the plurality of inputs 102 may represent axons tied to respective photoreceptors used to encode received light in the surrounding environment and transmit an electrical signal representing the received light. The electrical signal may be scaled to represent a magnitude or intensity of a received signal. For example, the plurality of inputs 102 may generate electrical signals that are proportional to an intensity of a received light signal. It should be noted that the use of photoreceptors and image recognition is provided merely by way of example and is not meant to be limiting. Other types of biological and electrical neural networks may be used to receive and process any type of input.

After receiving an input signal at the plurality of inputs 102, each of the plurality of inputs 102 may transmit pulses 106 to one or more neurons 104. The neural network 100 illustrates these pathways between the inputs 102 and the neurons 104 as a plurality of synapses 110. In a biological nervous system, a synapse is a structure that permits a neuron or nerve cell to pass an electrical or chemical signal to another neuron. In the neural network 100, biological synapses may be modeled using synapses 110 that pass a signal that is amplified/attenuated by synapse weights between the inputs 102 and the neurons 104 that represents the magnitude of the signal received by the inputs 102. The synapses 110 may also be weighted. For example, a single one of the plurality of inputs 102 may receive an input signal that is weighted differently by the synapses as it is sent to different neurons 104. The weighting of synapses 110 is what allows a neural network to "learn" to recognize specific input patterns and perform specific output tasks. When modeling the synapses 110 in a neural network, they may be represented by a semiconductor device that can receive a plurality of sequential input pulses and generate a corresponding output. For example, each input pulse may cause the synapse output to gradually increase between a logic 0 and a logic 1 level.

The synapses 110 may connect the inputs 102 to one or more neurons 104. These connections may be made in a one-to-many topology between the inputs 102 and the neurons 104. The neurons 104 in the neural network may be modeled after biological neurons, which are electrically excitable cells that communicate with other cells between connecting synapses. After receiving a sufficient number of input impulses, a neuron 104 may "fire" or transition into an excited state. The state may be associated with a sensory response (e.g., touch, sound, light, etc.) and/or motor controls from the brain. To approximate the behavior of a biological neuron, the inputs 102 in the neural network 100 may be implemented using any device that can receive a plurality of input pulses from one or more synapses 110, and after receiving a threshold number of input pulses, cause the outputs 108 of the neurons 104 to toggle between logic 0 and logic 1 states.

FIG. 1 illustrates a greatly simplified view of the neural network 100 in order to describe the various network components clearly. In practice, the neural network 100 may also include one or more hidden layer neurons and synapses between the inputs 102 and the outputs 108. These hidden or intermediate layers allow the task of generating the final outputs 108 to be broken down into sub-steps, each of which may be represented by a corresponding hidden layer of synapses and neurons. For example, the neural network 100 may be configured to distinguish between two different types of images, causing output 108a to fire when recognizing a first type of image, and causing output 108b to fire when recognizing a second type of image. A first hidden layer of neurons and synapses may recognize edges within the images. A second hidden layer of neurons and synapses may recognize shapes forwarded by the edges within the images. Finally, the neurons 104 in the output stage may combine the recognized shapes to distinguish between the first and second image types. Therefore, the neural network 100 may be far more complex in terms of electrical components and connections than may be readily apparent in FIG. 1. Because of the size, complexity, speed requirements, and/or routing difficulties that may accompany complex modern neural networks, there is a great need for circuit elements that can represent biological neurons and synapses in a way that can still allow for efficient layout and fabrication of many devices on a single technology node.

A neural network represents only one of many applications that may utilize the devices described in detail below. It should be understood that the example of a neural network is not meant to be limiting, but provides just one example of an operating environment that may benefit from the low-power characteristics of these devices.

Figure 2:
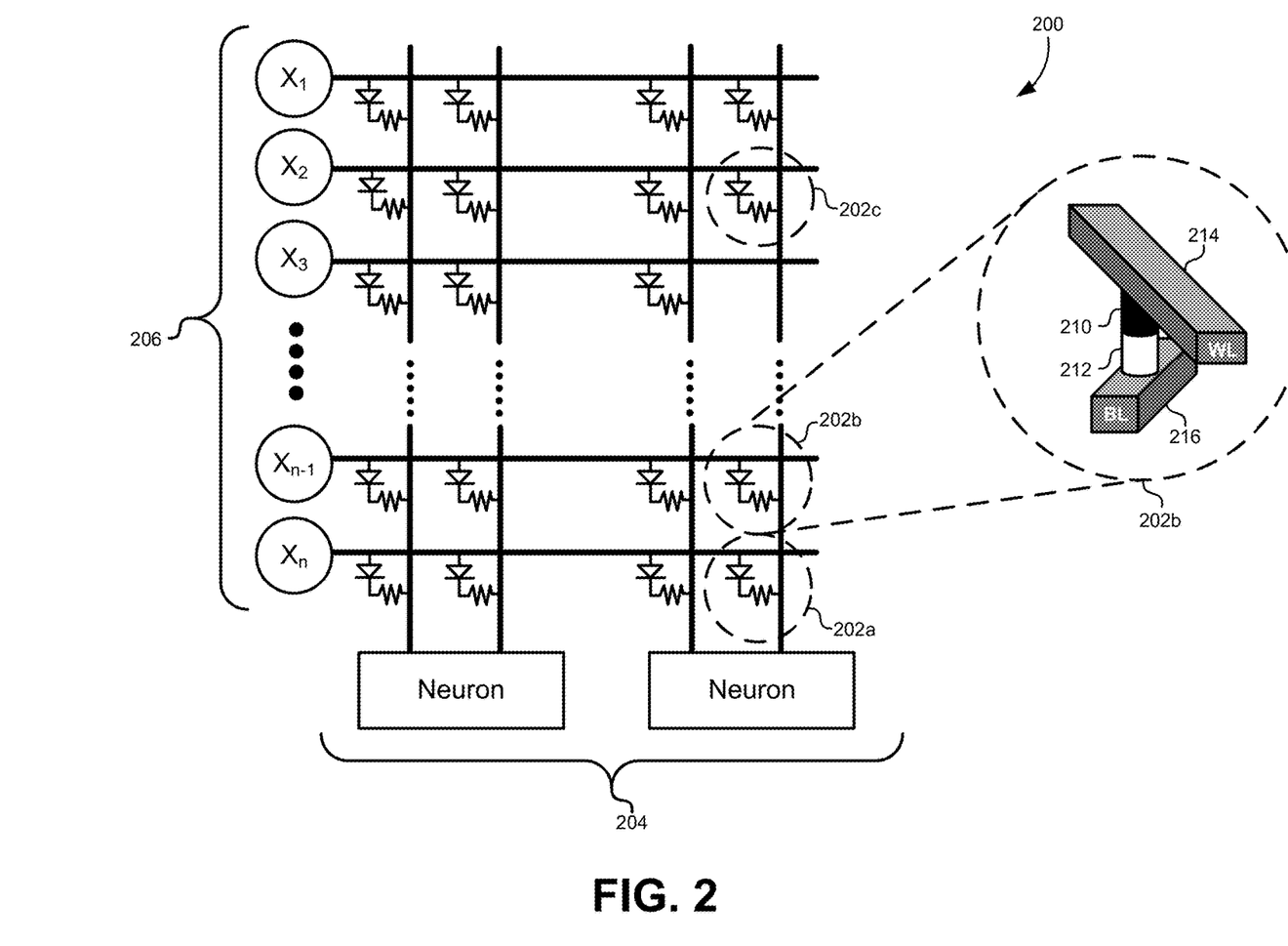
FIG. 2 illustrates a circuit network that implements a neural network, according to some embodiments.

FIG. 2 illustrates a circuit network 200 that implements a neural network, according to some embodiments. The neural network represented by the circuit network 200 may be similar to the neural network 100 in FIG. 1. As was the case for FIG. 1, FIG. 2 is a simplified view of a simple neural network where many connections and/or hidden layers may have been omitted for the sake of clearly describing the various circuit components that can be used to represent neurons and synapses. The circuit network 200 includes a plurality of inputs 206 that may correspond to the inputs 102 of FIG. 1. The inputs may be connected to a plurality of devices representing neurons 204 through devices representing synapses 202.

Many different devices may be used to represent synapses in the circuit network 200. In some embodiments, the synapses 202 may be implemented using semiconductor devices that can receive a plurality of input pulses and provide a proportional output to the neurons 204. Additionally, the neurons 204 may also be represented by discrete circuit devices. However, in contrast to the synapses 202 that gradually change their conductance with arriving excitation pulses, the neurons 204 may be configured to receive a plurality of pulses from the synapses 202 and fire after threshold number of pulses have been received. This basic network of circuit connections between the inputs 206 and the output neurons 204 may be augmented using hidden layers of transistors and/or other two-terminal resistive devices representing hidden layers of neurons and synapses as described above. When implementing the circuit network 200, it therefore may be beneficial to use semiconductor devices that can implement both the analog behavior of the synapses and the digital behavior of the neurons.

In some embodiments, many different types of devices may be used to implement the basic components of a neural network. For example, some embodiments may use a specific type of transistor known as a ferroelectric field-effect transistor (FeFET). A FeFET is a logic transistor that can maintain its logical state even when power is removed. FeFETs are similar to traditional metal oxide silicate (MOS) transistors, except that the logic gate dielectric is replaced with a ferroelectric material, which is a dielectric that "remembers," or stores electric fields to which it has been exposed. In a FeFET, a persistent dipole may be formed within the gate dielectric itself, thereby splitting the threshold voltage of the FeFET into two stable states that can represent binary logic states. Other embodiments may use ferroelectric FinFET devices.

In the embodiments described herein, the synapses may be represented by individual two-terminal memory elements. When using memory devices to model synapses, the circuit network 200 may be viewed as a form of non-volatile memory array. Each of the memory elements representing synapses 202 may be arranged in a rectangular grid pattern. In some embodiments, the grid pattern may be three-dimensional such that multiple grids lie above and below each other, as in a crosspoint memory array. Each of the memory elements may be configured to receive an applied voltage, and based on the polarity of the applied voltage, the memory elements representing the synapses 202 may change a physical state of a material in the memory element to represent a saved logic state, such as a logic 1 and a logic 0. When the voltage is no longer applied, the memory elements representing synapses 202 may save the logic state induced by the applied voltage, and thus may operate as non-volatile memory elements.

In order to apply the voltage needed to read/write to the memory elements, signals may be received from the horizontal lines from the plurality of inputs 206. These horizontal lines may act as a word line in a traditional memory array. The bit lines may run in a perpendicular direction and connect to the output neurons 204. Therefore, applying a voltage between a single one input of the word lines and a single input of the bit lines may cause voltage to be applied across a single one of the memory elements representing synapses 202. This process can be used to select a single synapse 202*b* for a read and/or write operation.

FIG. 2 illustrates a detailed view of a single synapse 202*b*. This synapse 202*b* shows a word line 214 and a bit line 216 coupled to a selector device 210 and a memory device 212. To minimize the leakage current through the circuit network 200, and to isolate memory elements connected on the same word/bit lines, the synapse 202*c* may each include the selector device 210. The selector device 210 may be implemented between the memory device 212 and the bit line 216. The selector device 210 may be used to reduce current from leaking through an individual memory element (i.e. synapse 202*b*) and the leakage and power dissipation of the whole array, as well as to prevent disturbances while a synapse is passively addressed to access a cell/synapse on the same bitline/wordline (unless a desired memory element/synapse is selected and sufficient voltage above the selector threshold is received by the synapse 202*b*). Therefore, when the voltage is applied to the word line 214 and the bit line 216, the synapse 202*b* is accessed while the selector devices in synapse 202*a* and synapse 202*c* may prevent their associated memory devices from being affected by the voltage on the shared bit line 216. Although not shown explicitly in FIG. 2, three-terminal selecting devices may also be used, such as transistors, to form a 1T-1C cell.

Figure 3A:
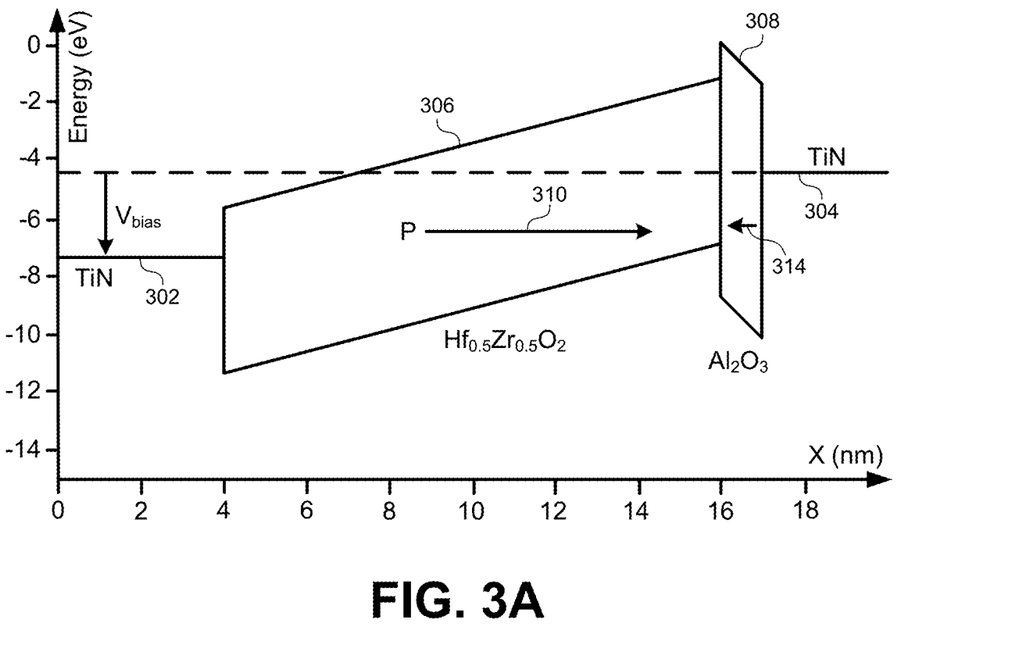
FIGS. 3A-3B illustrate energy band diagrams of a memory device, according to some embodiments.
Figure 3B:
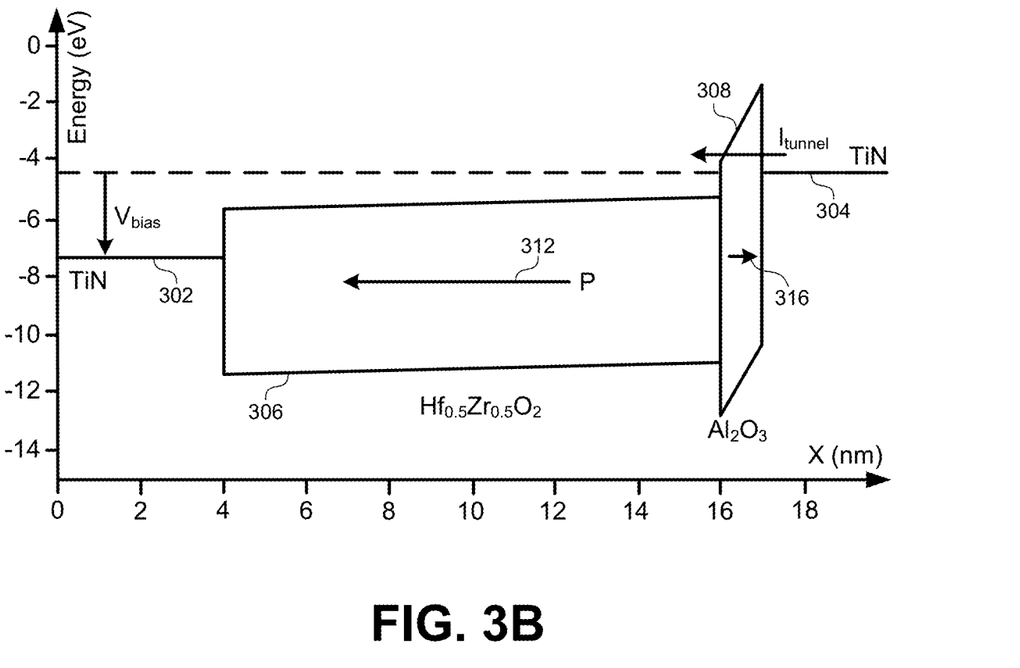

Many different technologies may be used to implement the memory device 212 and/or the selector device. FIGS. 3A-3B illustrate energy band diagrams of a memory device, according to some embodiments. The memory device in this example is a ferroelectric memory device. Ferroelectric memory devices include a ferroelectric material, or a material that spontaneously polarizes upon application of an electric field. The memory device may include a first electrode 302, a ferroelectric layer 306, a tunneling layer 308, and a second electrode 304. As a voltage may be applied across the first electrode 302 and the second electrode 304, ferroelectric dipoles may form in the ferroelectric layer 306. These ferroelectric dipoles may be persistent, which allows the ferroelectric device to function as a memory. For example, when the voltage is removed from the ferroelectric device, the ferroelectric dipoles may remain polarized or oriented in a direction of the previous applied voltage. The ferroelectric dipoles will maintain this polarization even after the voltage is removed. The orientation of these ferroelectric dipoles can be read from the memory device to effectively read a value from the memory. Applying a voltage of the opposite polarity may reverse the polarization of the ferroelectric dipoles once the coercive field is overcome to change the value stored in the memory element.

The tunneling layer 308 provides a tunneling barrier when the energy bands are bent due to an applied voltage. As illustrated in FIG. 3B, one purpose of the tunneling layer is to regulate the tunneling current through the device. Generally, device designers try to keep the tunneling layer 308 as thin as possible in comparison to the thickness of the ferroelectric layer (e.g., less than approximately 1 nm thick). The thinner the tunneling layer 308, the more readily tunneling current may flow through the device.

More importantly, a thinner tunneling layer 308 provides less degradation and interference with the retention capabilities of the memory device. The ferroelectric dipoles induced by the applied voltage form an internal electric field in the device. For example, when a voltage is applied from the first electrode 302 to the second electrode 304 in FIG. 3A, an electric field 310 may be induced in the ferroelectric layer 306 in the direction shown in FIG. 3A. Conversely, when a voltage is applied from the second electrode 304 to the first electrode 302 in FIG. 3B, an electric field 312 may be induced in the ferroelectric layer 306 in the direction shown in FIG. 3B. Maintaining this internal electric field is key in maintaining the retention of the memory device.

However, when an electric field 310 is formed in the ferroelectric layer 306, a depolarizing electric field 314 may be formed by the tunneling layer 308 in response. The formation of the depolarizing electric field 314 is a parasitic effect that tends to destabilize the retention of the memory device. The depolarizing electric field 314 may be formed as screening charges build up at the interfaces between the ferroelectric layer 306, the tunneling layer 308 and/or the electrodes 302, 304. The different dielectric constants may cause the depolarizing electric field 314 to form in a direction that is opposite of the internal electric field 310 in the ferroelectric layer 306. Therefore, the depolarizing electric field 314 tends to counteract the effect of the internal electric field generated by ferroelectric dipoles 310 in the ferroelectric layer 306. Note that a depolarizing electric field 316 may be formed in opposition to the internal electric field 312 formed in the ferroelectric layer 306 when the voltage is applied in the direction as shown in FIG. 3B.

Figure 4:
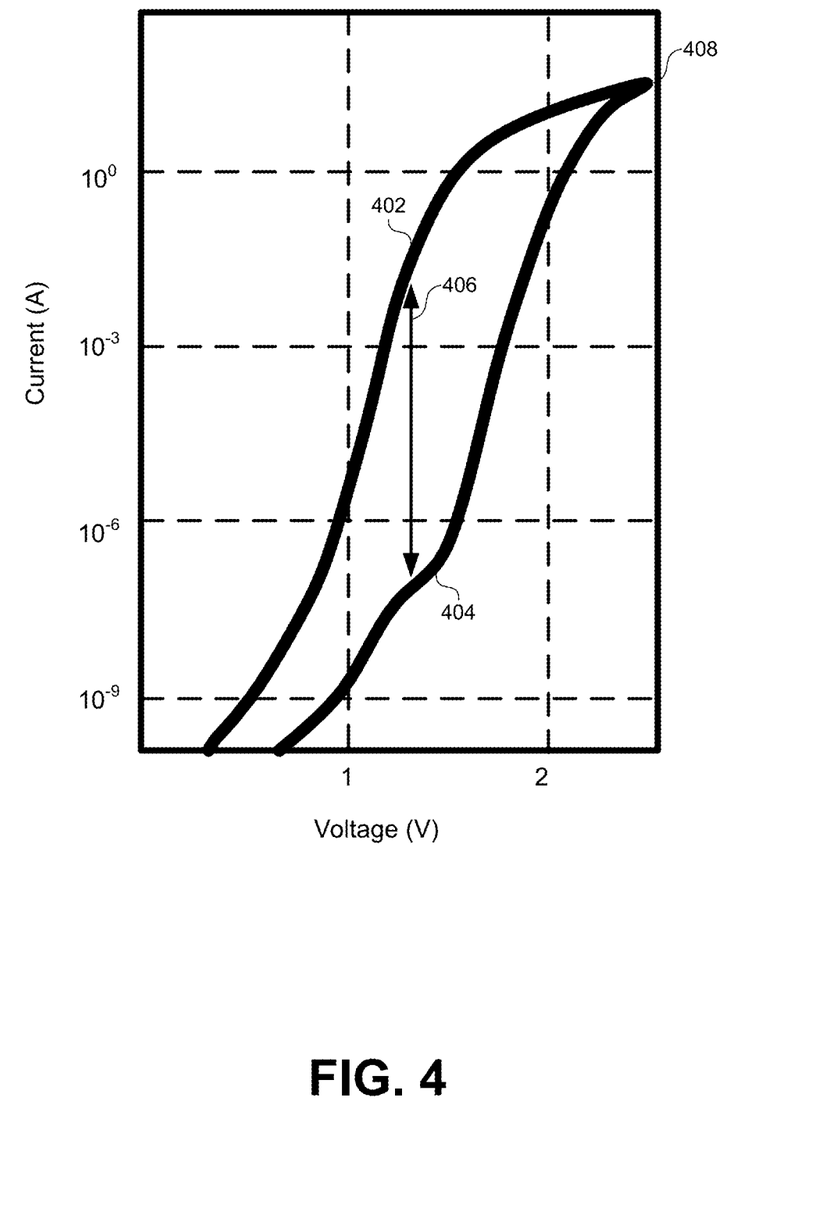
FIG. 4 illustrates a current/voltage diagram for a ferroelectric memory device, according to some embodiments.

FIG. 4 illustrates a current/voltage diagram for a ferroelectric memory device based on a ferroelectric tunnel junction, according to some embodiments. The ability of the memory device to retain a state is illustrated by the difference between the state of the device when turning on 404 versus the state of the device when turning off 402. When a voltage is applied to the device in the off state, the current/voltage of the device will hysterically move around the curve illustrated in FIG. 4 in a counterclockwise direction until it reaches the complete on state 408. The different current measurements corresponding to the same voltage show the on/off ratio or memory window of the device. As the thickness of the tunneling layer is decreased, the distance 406 of the ON/OFF ratio increases. The thickness of the tunneling layer is never increased beyond a minimum level in practice because it tends to shrink the distance 406 between on/off states and destroy the selectivity and retention of the device.

Because of the overwhelming negative effect of the depolarizing electric fields 314, 316 in the tunneling layer 308, conventional design techniques all seek to minimize the thickness of the tunneling layer 308 and consequently, the magnitude of the depolarizing electric field. Because the tunneling layer 308 acts as a dielectric, general capacitor theory and equations indicate that the strength of the depolarizing electric fields 314, 316 is function of the thickness of the tunneling layer 308. Because the depolarizing electric fields 314, 316 are known to reduce the memory retention of the memory device over time. Every effort is made to minimize the magnitude of this depolarizing electric field in the tunneling layer 308.

Contrary to known conventional device designs, some embodiments described herein may harness the negative effects of the depolarizing electric field tunneling layer to transform the ferroelectric memory device into a very effective selector device. Instead of selecting materials and thicknesses for the tunneling layer to minimize the depolarizing electric field, some embodiments may select materials and/or thicknesses for the tunneling layer to increase the depolarizing electric field such that it is greater than or equal to the electric field generated by the ferroelectric dipoles in the ferroelectric layer. While this destroys the retention of the memory device, rendering it unsuitable to be used as a memory, it is been discovered that the current/voltage characteristics of such a device can be used very effectively as a selector device rather than a memory.

Figure 5A:
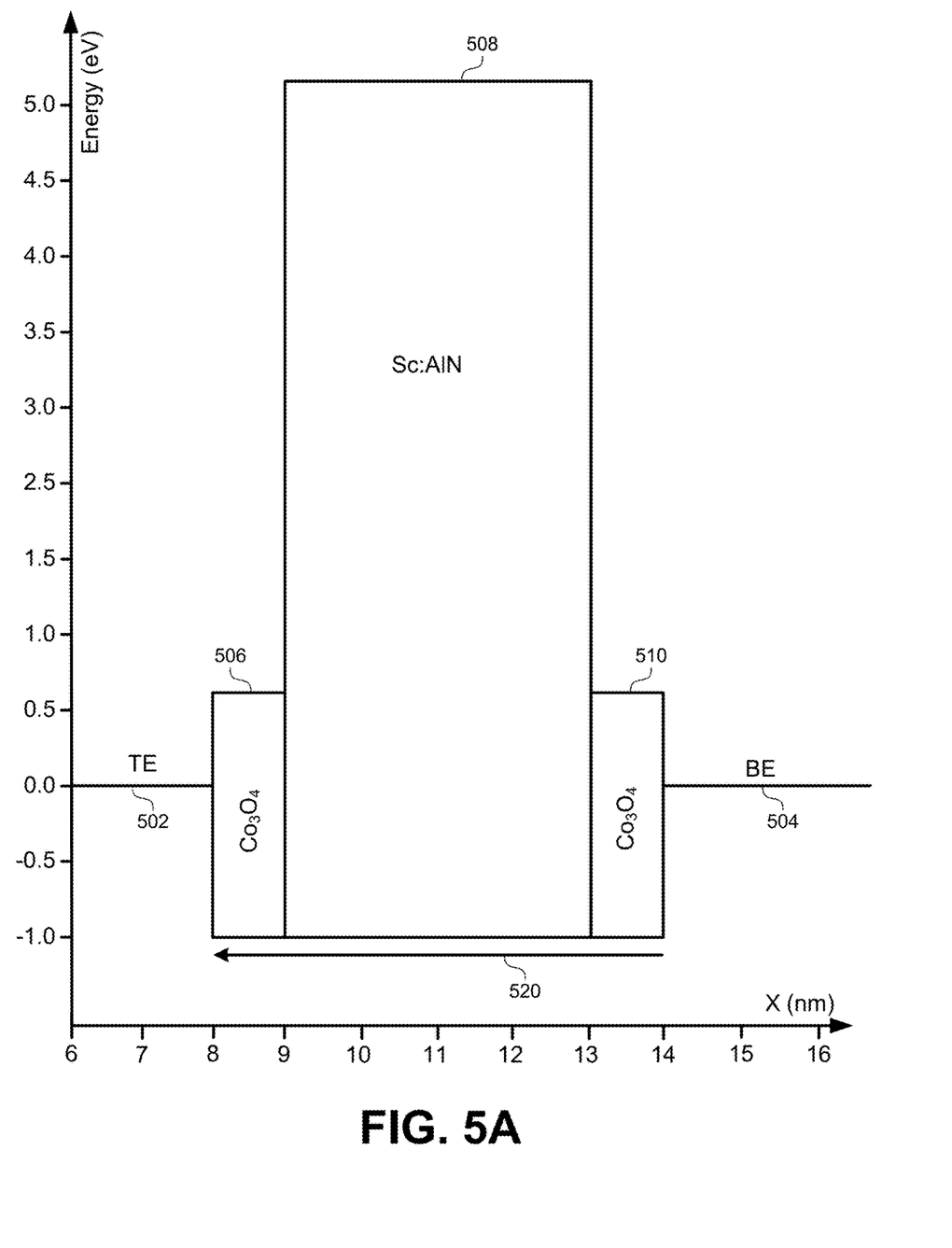
FIG. 5A illustrates a bidirectional ferroelectric selector device, according to some embodiments.

FIG. 5A illustrates a bidirectional ferroelectric selector device, according to some embodiments. In these embodiments, the thickness of the tunneling layer relative to the thickness of the ferroelectric layer may cause the depolarizing electric field induced by the tunneling layer to be greater than or approximately equal to the electric field induced in the opposite direction by ferroelectric dipoles in the ferroelectric layer when a voltage is applied across the device. The internal electric field to be overcome may be referred to as a coercive field. As described above, this coercive field may be responsible for the stability of the ferroelectric memory state. However, in the embodiments described herein, the device stack may be engineered to generate a depolarization field that overcomes the coercive field of the ferroelectric layer. Note that the device illustrated in FIG. 5A is provided only by way of example, and is not meant to be limiting. Specifically, the thicknesses of the various layers and the materials used for each of the layers may be replaced with any other materials/thicknesses described in this disclosure that will achieve the same effect.

In one example, a first electrode 502 may be formed from any type of conductive material, such as TiN, Pd, Pt, Ir, Ru, RuOx, IrOx, TiAlN, W, polysilicon, highly doped Si, and/or other materials having similar conductive properties. A first tunneling layer 506 may then be formed, followed by a ferroelectric layer 508. The thickness and/or dielectric constant of the material of the first tunneling layer 506 may be designed relative to the material and/or thickness of the ferroelectric layer 508. For example, some embodiments may use $Co_3O_4$ as a material for the first tunneling layer 506. Using this material, the first tunneling layer 506 may be between approximately 1 nm and approximately 4 nm thick. Other materials that may be used include amorphous silicon (aSi), silicon (Si), indium gallium zinc oxide (IGZO), germanium (Ge) and other similar materials. The material used for the first tunneling layer 506 may also be characterized based on the dielectric properties of the first tunneling layer 506. For example, materials may be used that are considered "low-k" materials having a dielectric constant less than approximately 20. The first tunneling layer 506 may also be characterized as having a relatively low bandgap energy that is less than approximately 3.5 eV. The first tunneling layer 506 may also be characterized as having a high electron affinity, such as electron affinity greater than approximately 4.0 eV.

The ferroelectric layer 508 may include any material that exhibits spontaneous polarization upon application of an electric field or external voltage. For example, ferroelectric materials may form ferroelectric dipoles when a voltage is applied as described above. In the embodiment illustrated in FIG. 5A, the ferroelectric layer 508 may be formed using aluminum nitride (AlN) that is doped with scandium (Sc:AlN). Other materials that may be used for the ferroelectric layer 508 include hafnium zirconium oxide (HZO), or hafnium oxide (HfOx) that is doped with materials (X) such as Si, Y, Al, N, Ga, Sr, (X:HfOx) or other similar materials. Some embodiments may use $BiFeO_3$ (BFO). As described below, the thickness of the ferroelectric layer 508 may vary depending on the type of material used in order to balance the electric field generated in the ferroelectric layer 508 with the depolarizing electric field generated by the first tunneling layer 506. For example, a thickness of between approximately 2 nm and approximately 4 nm may be used for HZO and/or X:HfOx. For Sc:AlN, a thickness of between approximately 3 nm and approximately 10 nm may be used. If the thickness is reduced, then the off current may be too large in the selector device. Using larger thicknesses may cause the transport mechanism to change in the device such that the current in the selector loses its steep, threshold-like "vertical" slope.

As mentioned above, the materials and/or thicknesses of the tunneling layer 506 and the ferroelectric layer 508 may be balanced such that the depolarizing electric field in the first tunneling layer 506 is greater than or approximately equal to the electric field in the ferroelectric layer 508. The electric field in the ferroelectric layer 508 may be calculated using standard techniques. The depolarizing electric field may be calculated using the following equation (1).

$$E_{dep} = \frac{P_r}{k_{FE}\varepsilon_0}\left(1 + \frac{k_{IF}d_{FE}}{k_{FE}d_{IF}}\right)^{-1} \quad (1)$$

In this equation, $E_{dep}$ represents the depolarizing electric field generated by tunneling layer 506, $P_r$ represents the remnant polarization, $k_{IF}$ and $k_{FE}$ represent the dielectric permittivity of the tunneling layer 506 and the ferroelectric layer 508, respectively, $\varepsilon_0$ represents the vacuum permittivity, and $d_{IF}$ and $d_{FE}$ represent the thickness of the tunneling layer 506 and the ferroelectric layer 508, respectively. The parameters in this equation may be used to balance the magnitude of the depolarizing electric field such that it is greater than or approximately equal to the electric field generated in the ferroelectric layer 508. For example, to increase the magnitude of the depolarizing electric field, the k-value of the first tunneling layer 506 may be decreased or the thickness of the tunneling layer 506 may be increased.

When selecting materials for the tunneling layer(s) and/or the ferroelectric layer, another consideration may be the band alignment between the types of materials. In the example of FIG. 5A, the energy bands for the tunneling layers 506, 510 are aligned with the bottom of the energy band for the ferroelectric layer 508. This ensures that the device provides a very vertical response as described below in FIG. 6, while still eliminating any memory/retention that would ruin the symmetric response of the device.

In some embodiments, a second tunneling layer 510 may also be included between the ferroelectric layer 508 and a second electrode 504. Inclusion of the second tunneling layer 510 is optional, and it allows the device to function bidirectionally as a bipolar selector. Thus, applying voltages in either direction across the first electrode 502 and/or the second electrode 504 may generate nearly symmetrical current/voltage curves for positive and negative voltages. The material, thickness, and other characteristics of the second tunneling layer 510 may be similar to those described above for the first tunneling layer 506. It should be emphasized that the second tunneling layer 510 is optional and may be omitted from designs where unidirectional functionality is desired.

FIG. 5A illustrates the device when a voltage is not applied in a so-called "flatband" condition. Note that the tunneling distance 520 extends across the length of the device. Thus, when a sufficient voltage is not applied across the device, the device forms a very strong selector that blocks current flow through the device. For example, when used in a memory array or a neural network as described above, this ferroelectric selector may receive low levels of voltage as nearby selector devices are enabled on the same word/bit lines. The current at these low-voltage levels is very small using this device as a selector.

Figure 5B:
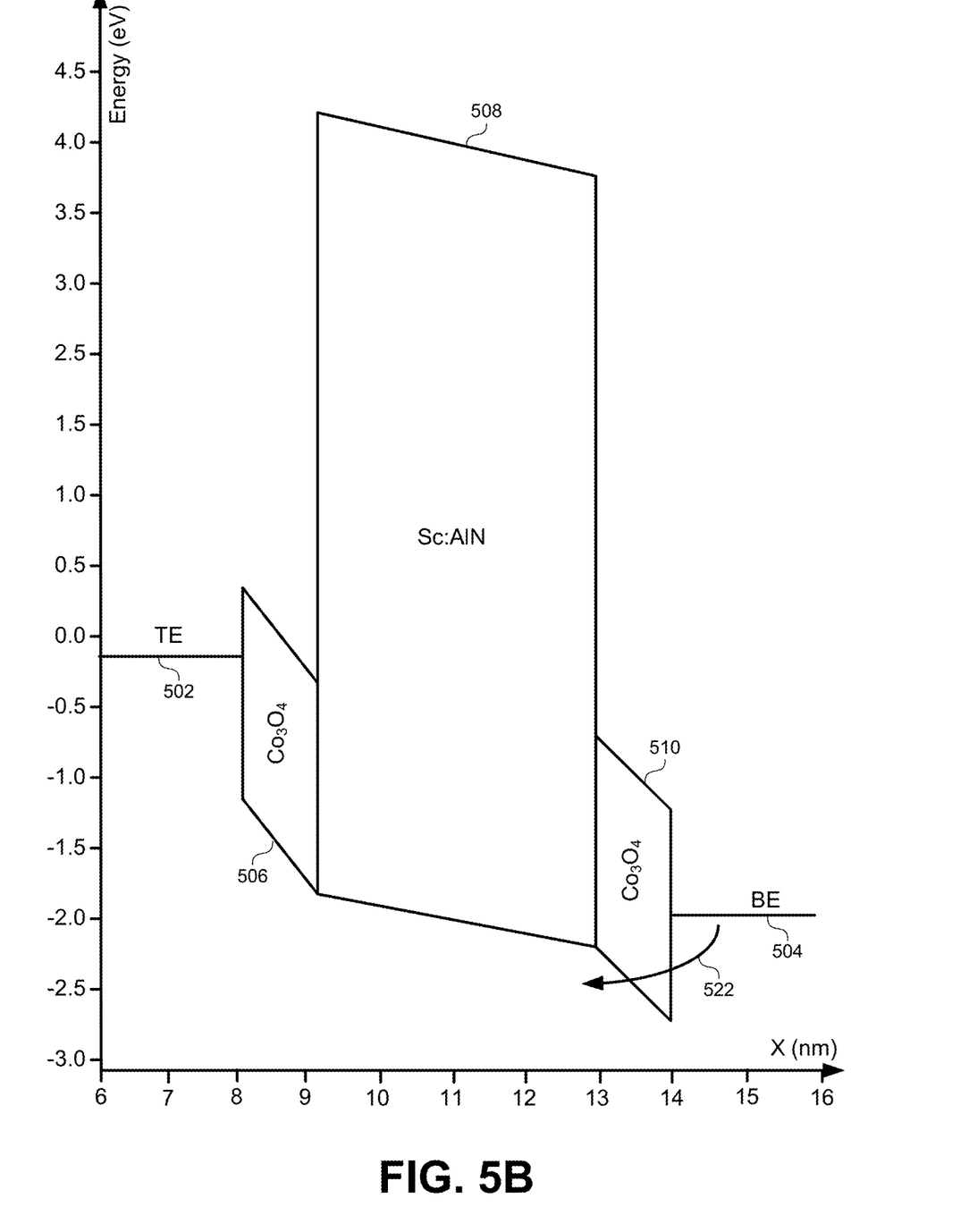
FIG. 5B illustrates a diagram of the selector device when a voltage is applied across the selector device, according to some embodiments.

FIG. 5B illustrates a diagram of the selector device when a voltage is applied across the selector device, according to some embodiments. The voltage applied across the electrodes 502, 504 of the device may cause the energy bands within the device to bend as shown in FIG. 5B. In this example, current may begin to flow through the second tunneling layer 510 as the tunneling distance 520 shrinks significantly as the bands are bent. The more voltage that is applied to the device, the more the bands will bend, and the more the tunneling distance 522 will shrink. This leads to a very sharp increase in current flowing through the device as voltage is applied beyond a threshold amount.

Figure 6:
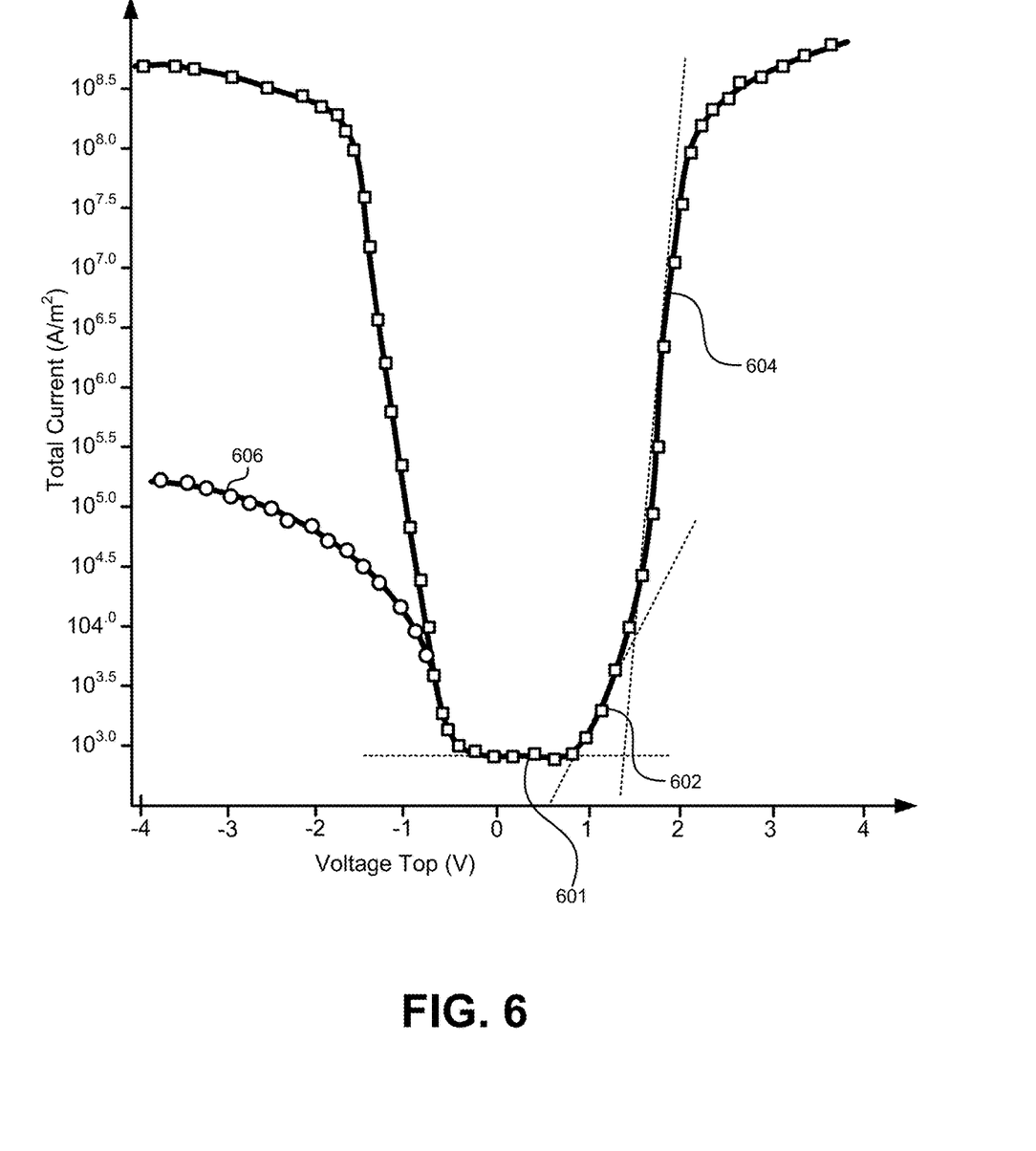
FIG. 6 illustrates a graph of a voltage/current curve from the ferroelectric selector device, according to some embodiments.

FIG. 6 illustrates a graph of a voltage/current curve from the ferroelectric selector device, according to some embodiments. The first portion 601 of the voltage/current curve is fairly flat. For voltages below the threshold alignment of the tunneling bands and the switching of ferroelectric, the resistance of the selector device is very large, making it an effective selector. However, as the voltage is increased and the bands illustrated in FIG. 5B begin to bend, the current/voltage curve may enter a second portion 602 having a significantly steeper slope. For example, as the energy band of the ferroelectric layer 508 begins to bend upward, the charge carriers may begin to tunnel through the tunneling layer 506 and the ferroelectric layer 508 at an increasing rate. Finally, once the applied voltage overcomes the coercive voltage, the dipoles in the ferroelectric layer may switch, causing the energy band of the ferroelectric layer 508 to bend as illustrated in FIG. 5B, the voltage/current curve may enter a third portion 604 having a very steep slope. The steep slope in this third portion 604 is an ideal response for an effective selector device that turns on entirely when a sufficient voltage is applied. A further increase of the voltage may result in saturation of the tunneling current, causing a complete voltage drop over a memory cell connected in series with selector element, and thus resulting in ideal selector behavior.

In contrast to the curve illustrated in FIG. 4, the return path of the voltage/current curve illustrated in FIG. 6 is nearly identical to the forward path of the voltage/current curve. In other words, as voltage is removed from the device, the current follows the same path back to its starting value as was followed by the current when the voltage was increased. This symmetrical response may be caused by the depolarizing electric field described above. Because the depolarizing electric field is greater than or approximately equal to the electric field of the ferroelectric layer, no state is effectively stored in the device as a whole.

FIG. 6 also illustrates a portion 606 of the voltage/current curve that may be observed when the selector device is not bidirectional. For example, the second tunneling layer 510 may be removed from the selector device in FIG. 5A. In this case, the portion 606 of the voltage/current curve in the opposite direction provides a rectifying effect and acts in a manner similar to a junction diode.

Figure 7:
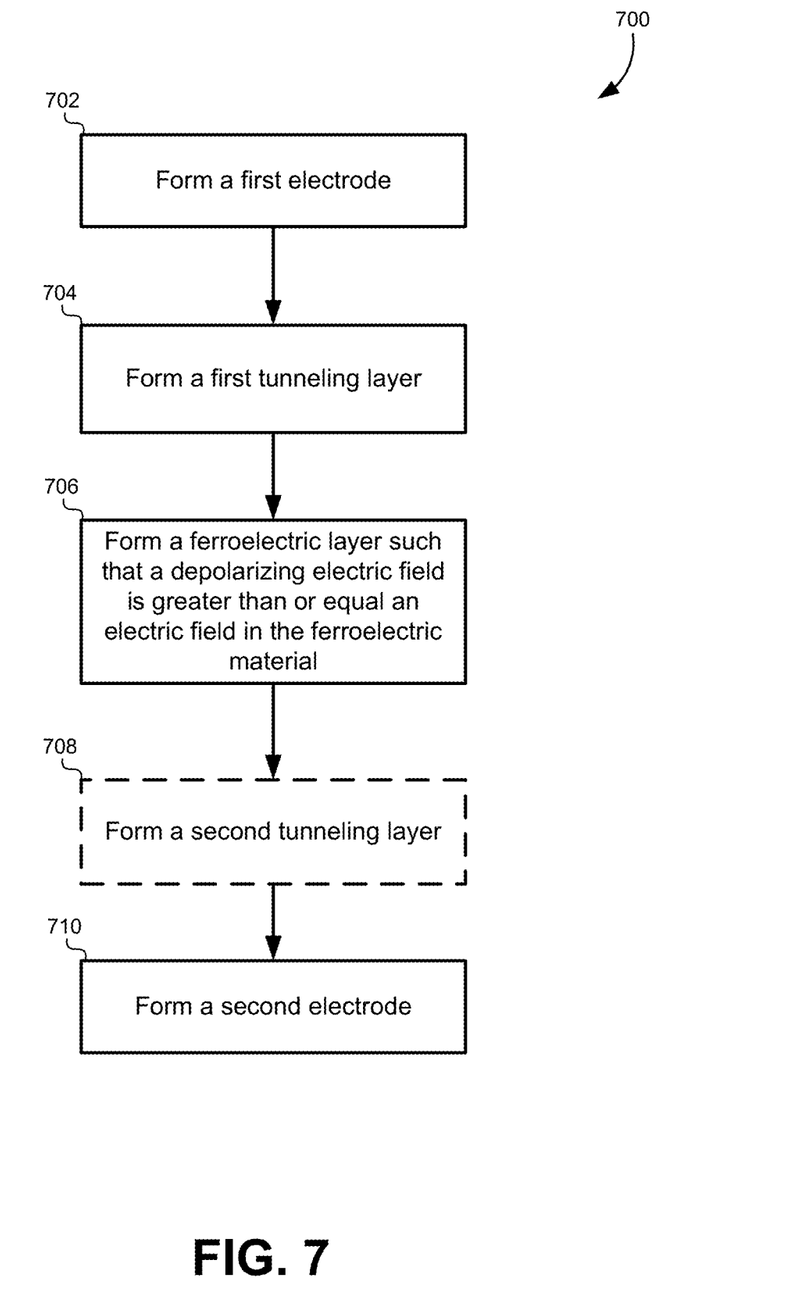
FIG. 7 illustrates a method of fabricating a ferroelectric selector device, according to some embodiments.

FIG. 7 illustrates a method of fabricating a ferroelectric selector device, according to some embodiments. This method may fabricate a device using a silicon wafer fabrication process where different layers of material are deposited or otherwise layered on a silicon substrate. Metal layers may be used to connect a plurality of devices together to form an integrated circuit. For example, the ferroelectric selector device described herein may be fabricated on a silicon wafer with many other selector devices and/or memory devices that are connected by various metal layers into a neural network or crossbar memory array, among many other types of applications. Traditional methods may be used to form each of the layers described below, including atomic layer deposition (ALD), physical vapor deposition (PVD), sputtering, chemical vapor deposition (CVD) plasma-enhanced chemical vapor deposition (PE-CVD), and/or other similar techniques. Each of these layers may be deposited in a vertical stack in a front end of line (FEOL) or a back end of line (BEOL) IC fabrication process.

The method may include forming a first electrode (702). The first electrode may have a work function that is relatively low compared to a work function of a second electrode that will be described below. The first electrode may have a work function of between approximately 4.9 eV and 5.3 eV. For example, the work function of the first electrode may be between approximately 4.9-5.0 eV, approximately 5.0-5.1 eV, approximately 5.1-5.2 eV, approximately 5.2-5.3 eV, approximately 4.4-4.6 eV, approximately 4.5-4.7 eV, approximately 4.6-4.8 eV, approximately 4.7-4.9 eV, approximately 4.8-5.0 eV, approximately 4.9-5.1 eV, approximately 5.0-5.2 eV, approximately 5.1-5.3 eV, approximately 4.4-4.7 eV, approximately 4.5-4.8 eV, approximately 4.6-4.9 eV, approximately 4.7-5.0 eV, approximately 4.8-5.1 eV, approximately 4.9-5.2 eV, approximately 5.0-5.3 eV, and/or any combination of these approximate ranges. Increasing the work function of the first electrode may increase the on-state conductivity of the device. The first electrode may be deposited using a layer of platinum, and/or any other high-work-function conductive material, such as, Pd, IrO, RuO, W, Ir, and/or the like.

The method may also include forming a first tunneling layer (704). The first tunneling layer may be formed on top of the first electrode. In some embodiments, no intervening layers may be included between the first electrode and the first tunneling layer. The first tunneling layer may be deposited as a layer of a cobalt oxide, such as $Co_3O_4$. Some embodiments may also use a layer of amorphous silicon, another high-affinity oxide, or any of the other materials described above. For example, the first tunneling layer may have a dielectric constant less than approximately 20, a bandgap energy of less than approximately 3.5 eV, an electron affinity greater than approximately 4.0 eV. The first tunneling layer may be between approximately 1 nm and approximately 4 nm thick. Any of the other characteristics of the first tunneling layer that are described elsewhere in this disclosure may also be realized in this fabrication step.

The method may also include forming a ferroelectric layer (706). The ferroelectric layer may include any material that polarizes into ferroelectric dipoles upon application of an electric field. For example, the ferroelectric layer may comprise aluminum nitride that is doped with scandium or any of the other materials described above. In some embodiments, the ferroelectric layer may be between approximately 3 nm and approximately 10 nm thick. The thickness of the tunneling layer and the thickness of the ferroelectric layer may be formed such that the electric field induced in the tunneling layer may be greater than or approximately equal to the electric field induced in an opposite direction by the ferroelectric dipoles in the ferroelectric layer when a voltage is applied across the selector device. For example, the permittivity or dielectric constants of the materials and the thickness of the ferroelectric layer may be inserted into equation (1) above to determine a required minimum thickness of the first tunneling layer. The tunneling layer may also be referred to as a depolarization layer.

Optionally, the method may also include forming a second tunneling layer (708). The second tunneling layer may be formed to be similar to the first tunneling layer described above. A second electrode may be formed (710) on top of the second tunneling layer or the ferroelectric layer, depending on the embodiment. The second electrode may be formed from a material that is different from the first electrode and generate a work function differential as described above. The work function differential may be approximately 0.3 V, 0.4 V, 0.5 V, 0.6 V, and 0.7 V, by way of example. Note that some embodiments may directly form the layers described above on top of each other to form a vertical stack. For example, the first electrode may be deposited first, followed by the tunneling layer on top of the first electrode, followed by the ferroelectric layer on top of the first tunneling layer, and so forth. In other embodiments, intervening layers may be placed between the layers described above without limitation. For example, when forming a selector in a selector/memory combination, the memory device may be placed between the ferroelectric layer and the second electrode. Metal layers may also be provided to form connections to a neural network or other memory elements in a crossbar memory array.

It should be appreciated that the specific steps illustrated in FIG. 7 provide particular methods of fabricating ferroelectric selector device, according to various embodiments. Other sequences of steps may also be performed according to alternative embodiments. For example, alternative embodiments may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. Many variations, modifications, and alternatives also fall within the scope of this disclosure.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

Throughout this disclosure, the term "approximately" may be used to describe values that occur within a range of −15% to +15% of the stated value. For example, a capacitance of approximately 100 nm may fall within the range of 85 nm to 115 nm.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A method of fabricating a selector device, the method comprising:
   forming a first electrode;
   forming a tunneling layer;
   forming a ferroelectric layer, wherein:
   the tunneling layer is between the first electrode and the ferroelectric layer; and
   a thickness and dielectric constant of the tunneling layer relative to a thickness and dielectric constant of the ferroelectric layer causes a depolarizing electric field to be greater than or approximately equal to an electric field induced in an opposite direction by ferroelectric dipoles in the ferroelectric layer when a voltage is applied across the selector device; and
   forming a second electrode, wherein the ferroelectric layer is between the tunneling layer and the second electrode.

2. The method of claim 1, wherein the ferroelectric layer comprises a material that spontaneously polarizes upon application of an electric field.

3. The method of claim 1, wherein the ferroelectric layer comprises a layer of aluminum nitride (AlN) that is doped with scandium (Sc).

4. The method of claim 3, wherein the layer of aluminum nitride is between approximately 3 nm and approximately 10 nm thick.

5. The method of claim 1, wherein the ferroelectric layer comprises a layer of hafnium oxide.

6. The method of claim 5, wherein the layer of hafnium oxide is between approximately 2 nm and approximately 4 nm thick.

7. The method of claim 5, wherein the layer of hafnium oxide is doped with one or more of the following materials: Si, Y, Al, N, Ga, and Sr.

8. The method of claim 1, further comprising forming a second tunneling layer, wherein the second tunneling layer is between the ferroelectric layer and the second electrode.

9. The method of claim 1, wherein the tunneling layer comprises a dielectric constant less than approximately 20.

10. The method of claim 1, wherein the tunneling layer comprises a bandgap energy of less than approximately 3.5 eV.

11. A method of fabricating a selector device, the method comprising:
    forming a first electrode;
    forming a tunneling layer comprising $Co_3O_4$ that is between approximately 1 nm and approximately 3 nm thick;
    forming a ferroelectric layer comprising aluminum nitride (AlN) doped with scandium (Sc) that is between approximately 3 nm and approximately 10 nm thick, wherein the tunneling layer is between the first electrode and the ferroelectric layer; and
    forming a second electrode, wherein the ferroelectric layer is between the tunneling layer and the second electrode.

12. The method of claim 11, further comprising forming a connection to a memory element.

13. The method of claim 12, wherein the device and the memory element are part of a crossbar memory array.

14. The method of claim 12, wherein the device and the memory element are part of a neural network.

15. The method of claim 11, wherein the first electrode comprises a first material and the second electrode comprises a second material that is different from the first material.

16. The method of claim 15, wherein a work function associated with first electrode is less than a work function associated with the second electrode.

17. The method of claim 11, wherein the tunneling layer comprises a layer of $Co_3O_4$.

18. The method of claim 11, wherein the tunneling layer comprises an electron affinity that is greater than approximately 4.0 eV.

* * * * *